(12) United States Patent
Raidl et al.

(10) Patent No.: US 12,261,581 B2
(45) Date of Patent: Mar. 25, 2025

(54) TUNABLE MATCHING NETWORK

(71) Applicant: Apple Inc., Cupertino, CA (US)

(72) Inventors: Alfred Erik Raidl, Linz an der Donau (AT); Antonio Passamani, Munich (DE); Chia-Yu Hsieh, Munich (DE)

(73) Assignee: Apple Inc., Cupertino, CA (US)

( * ) Notice: Subject to any disclaimer, the term of this patent is extended or adjusted under 35 U.S.C. 154(b) by 329 days.

(21) Appl. No.: 17/864,188

(22) Filed: Jul. 13, 2022

(65) Prior Publication Data

US 2024/0022226 A1 Jan. 18, 2024

(51) Int. Cl.
H03H 7/38 (2006.01)
H03H 7/01 (2006.01)
H03H 7/09 (2006.01)
H03H 7/42 (2006.01)
H03M 1/66 (2006.01)
H04B 1/04 (2006.01)
H04B 1/18 (2006.01)
H04B 1/40 (2015.01)

(52) U.S. Cl.
CPC ............ H03H 7/38 (2013.01); H03M 1/66 (2013.01); H04B 1/40 (2013.01)

(58) Field of Classification Search
None
See application file for complete search history.

(56) References Cited

U.S. PATENT DOCUMENTS

| | | | |
|---|---|---|---|
| 8,674,764 B2 | 3/2014 | Kondo | |
| 9,054,756 B2 | 6/2015 | See et al. | |
| 11,271,610 B2* | 3/2022 | Jung | H02J 50/12 |
| 2014/0049318 A1* | 2/2014 | Goswami | H03M 1/008 |
| | | | 330/253 |
| 2017/0077904 A1* | 3/2017 | Bhagavatula | H03H 11/32 |
| 2020/0212862 A1* | 7/2020 | Hulsteijn | H04B 1/0458 |
| 2021/0119596 A1 | 4/2021 | Yu et al. | |
| 2022/0069854 A1* | 3/2022 | Jia | H04B 1/1036 |
| 2024/0007058 A1* | 1/2024 | Ayranci | H03H 7/00 |

FOREIGN PATENT DOCUMENTS

| | | | | |
|---|---|---|---|---|
| CN | 115769491 A * | 3/2023 | | H01Q 1/50 |
| WO | WO-2020139371 A1 * | 7/2020 | | H03B 19/14 |
| WO | WO-2021227902 A1 * | 11/2021 | | H03F 1/0288 |

* cited by examiner

Primary Examiner — Mohammed Rachedine
(74) Attorney, Agent, or Firm — FLETCHER YODER PC

(57) ABSTRACT

Systems and methods for generating a radio frequency (RF) signal by a digital-to-analog converter (DAC) with transmission frequency within a wide transmission frequency range are described. An output reactance of the DAC coupled (directly or indirectly) to one or more antennas corresponds to the transmission frequency of the RF signals. Multiple embodiments of the DAC are described to include circuitry for tuning the output reactance of the DAC, and therefore, shifting a center frequency to select a transmission frequency range (from multiple transmission frequency ranges) for providing the RF signals.

20 Claims, 10 Drawing Sheets

TUNABLE MATCHING NETWORK

BACKGROUND

This disclosure generally relates to digital-to-analog converters (DACs) and order of enablement of unit cells of the DACs.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Numerous electronic devices—including televisions, portable phones, computers, wearable devices, vehicle dashboards, virtual-reality glasses, and more—utilize DACs to generate analog electrical signals from digitally coded data. For example, an electronic device may use one or more DACs to convert digital signals to analog signals for transmission via radio frequency (RF) circuitry. In some cases, each DAC may provide analog signals (e.g., RF signals) in response to receiving the digitally coded data in a specific frequency range. Accordingly, an electronic device may include multiple DACs each providing analog signals in a different frequency range.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an electronic device is described. The electronic device may include one or more antennas and a transmitter. The antennas may transmit one or more radio frequency (RF) signals. The transmitter may be coupled to the one or more antennas. The transmitter may include a transformer. Moreover, the transformer may include a primary portion and a secondary portion. The primary portion may receive one or more analog signals indicative of the one or more RF signals. The primary portion may include a first inductor, a second inductor, and an impedance tuning circuit. The impedance tuning circuit may be coupled in series between the first inductor and the second inductor. Moreover, the impedance tuning circuit may include a first auxiliary inductor selectable to decrease a transmission frequency range of the transmitter based on an inductance value of the first auxiliary inductor. The impedance tuning circuit may also include a first auxiliary capacitor coupled in parallel to the first auxiliary inductor. The first auxiliary capacitor may be selectable to increase the transmission frequency range of the transmitter based on a capacitance value of the first auxiliary capacitor. The secondary portion may provide the one or more analog signals to one or more downstream components of the electronic device for transmission via the one or more antennas. Moreover, the secondary portion may include a third inductor that may inductively couple to the first inductor, and a fourth inductor that may inductively couple to the second inductor In another embodiment, a radio frequency (RF) transmitter is described. The RF transmitter may include a digital-to-analog converter (DAC) and a transformer. The DAC may generate one or more analog signals based on receiving one or more data bits. Moreover, the transformer may include a primary portion and a secondary portion. The primary portion may be coupled to the DAC to receive the one or more analog signals. The primary portion may include a first inductor, a second inductor, and a first impedance tuning circuit. The first impedance tuning circuit may include at least a first auxiliary capacitor and may be coupled in series between the first inductor and the second inductor. The secondary portion may convey the one or more analog signals to a downstream load. The secondary portion may include a third inductor configured to inductively couple to the first inductor, and a fourth inductor coupled in series with the third inductor and configured to inductively couple to the second inductor.

In yet another embodiment, a method is described. The method may include receiving, by a processor of an electronic device, a first request to transmit a first radio frequency (RF) signal with a first transmission frequency. The processor may adjust an output reactance of a digital-to-analog converter (DAC) of the electronic device to correspond with the first transmission frequency. Moreover, the DAC may generate the first RF signal with the first transmission frequency.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
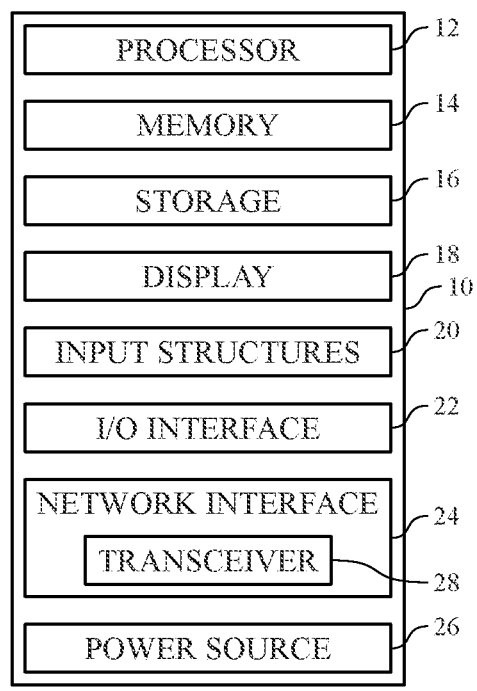
FIG. 1 is a block diagram of an electronic device, according to embodiments of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

This disclosure is directed to a radio frequency (RF) impedance tuning circuit for RF signal transmission over a wide transmission frequency range using a (or each) digital-to-analog converter (DAC) (e.g., wider than a transmission frequency range of a conventional digital-to-analog converter (DAC), such as wider or greater than 1 gigahertz (GHz), 1.5 GHz, 2 GHz, 2.5 GHz, 3 GHz, 4 GHz, 5 GHz, 6 GHz, and so on). For example, an electronic device may include a transmitter including the DAC and the impedance tuning circuit that may provide RF signals to one or more antennas for transmission. In some cases, the DAC may generate and provide analog signals to the impedance tuning circuit. The impedance tuning circuit may provide (e.g., convey) the analog signals with a desired output impedance to one or more downstream components (e.g., power amplifiers, filters, the antennas) for transmission. In particular, the DAC may receive data bits indicative of the RF signals and generate the analog signals with a transmission frequency within the wide transmission frequency range, as will be appreciated.

In some embodiments, the DAC may couple to such impedance tuning circuit (e.g., a transformer). The DAC may receive the data bits from different circuit components of the transmitter (and/or the electronic device). Moreover, the DAC may include a number of electrical components, such as one or more resistors and/or capacitors. The DAC may couple to a primary portion of the transformer to provide the analog signals to the transformer based on receiving the data bits. The primary portion of the transformer may be inductively coupled to a secondary portion of the transformer. The secondary portion of the transformer may provide the analog signals to the one or more downstream components with a frequency corresponding to (e.g., equal to, substantially equal to, convertible to) the RF signal transmission frequency.

In particular, the primary portion and the secondary portion of the transformer may each include a number of fixed inductors. The fixed inductors of the primary portion may inductively couple to the fixed inductors of the secondary portion to transfer electrical currents that are based on the data bits to provide the analog signals with the desired transmission frequency. A combined resistance and reactance of each of the fixed inductors of the transformer and electrical components of the equalizer (e.g., the one or more resistors and/or capacitors) may determine a first output impedance of the transformer for providing the analog signals generated by the DAC.

A transmission frequency range of the electronic device and an associated center frequency for transmitting the RF signals may be based on a relationship (e.g., a matching relationship, a nearly matching relationship, a controlled relationship) between an output impedance of the DAC (adjustable/tunable by the transformer) and an input impedance of one or more downstream components coupled to the transformer (e.g., the power amplifier, the filters, the antennas, among other things). Moreover, in some cases, the input impedance of the one or more downstream components may be constant (e.g., relatively constant, approximately constant). As such, adjusting the output impedance of the DAC by adjusting an output impedance of the transformer may correspond to an adjustment of the transmission frequency range of the RF signals by the electronic device. For example, based on having a first output impedance, the DAC may provide the analog signals with a first transmission frequency within a first transmission frequency range centered on a first center frequency. Moreover, the one or more downstream components may generate and/or transmit the RF signals based on receiving the analog signals with the first transmission frequency.

With the foregoing in mind, the transformer may include a number of selectable auxiliary impedance tuning components for adjusting the output impedance of the DAC. Selecting each of the auxiliary impedance tuning components may adjust the output impedance (e.g., resistance and/or reactance) of the DAC to select a different center frequency. As such, the DAC and the transformer may provide the analog signals with a transmission frequency within a different transmission frequency range based on a selected center frequency.

Selecting different auxiliary impedance tuning components may adjust (increase or decrease) the output impedance associated with providing the analog signals generated by the DAC by different values. In some embodiments, the auxiliary impedance tuning components may include multiple auxiliary capacitors and/or inductors. For example, the auxiliary capacitors may be positioned in the transformer such that selecting each auxiliary capacitor may decrease an output reactance associated with providing the analog signals generated by the DAC.

A capacitance value of the selected auxiliary capacitance may correspond to a decreased reactance value of the output reactance associated with providing the analog signals generated by the DAC. Moreover, decreased reactance value of the output reactance may correspond to an increase of the center frequency based on a matching (or controlled mismatch) between the output impedance of the DAC/transformer and an input impedance of the one or more downstream components. Accordingly, selecting the auxiliary capacitors may increase the center frequency, and therefore, shift the transmission frequency range higher. Furthermore, the capacitance value of the selected auxiliary capacitor may correspond to the increased value in the center frequency and the shift in the transmission frequency range higher.

Moreover, the auxiliary inductors are positioned in the DAC such that selecting each auxiliary inductor may increase the output reactance associated with providing the analog signals generated by the DAC. An inductance value of the selected auxiliary inductor may correspond to an increased reactance value of the output reactance. Moreover, increased reactance value of the output reactance may correspond to a decrease of the center frequency based on a matching (or controlled mismatch) between the output impedance of the DAC/transformer and an input impedance of the one or more downstream components. Accordingly, selecting the auxiliary inductors may decrease the center frequency, and therefore, shift the transmission frequency range lower. Furthermore, the inductance value of the selected auxiliary capacitor may correspond to the decreased value in the center frequency and the shift in the transmission frequency range lower.

In any case, the DAC and the transformer may provide the analog signals with various transmission frequencies within a relatively narrow transmission frequency range (e.g., relatively narrow/fixed transmission frequency range, comparably narrow/fixed transmission frequency range). Nevertheless, in different cases, the DAC and the transformer may provide the analog signals with the various transmission frequencies within respective shifted narrow transmission frequency ranges to provide an aggregated wide transmission frequency range. As discussed above, selecting different center frequencies for each DAC/transformer by adjusting the output impedance (e.g., reactance) of the respective DACs may shift the respective narrow transmission frequency ranges. As described above, the processor may provide the control signals to select one or more of the auxiliary tuning components to select the center frequency and shift the transmission frequency range based on adjusting the output impedance of the DAC/transformer. Accordingly, the DAC may provide the analog signals with transmission frequencies within a range of frequency ranges based on shifting the center frequency and the transmission frequency range.

In some embodiments, the auxiliary capacitors and inductors may be coupled in parallel and between the fixed inductors of the primary portion and/or between the fixed inductors of the secondary portion of the transformer. In such cases, a processor (or any other viable controlling device) may provide control signals to select one or more of the auxiliary capacitors and inductors. Accordingly, the DAC may provide the analog signals with a transmission frequency within a wide transmission frequency range.

With the foregoing in mind, FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 20, an input/output (I/O) interface 22, a network interface 24, and a power source 26. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 20, the input/output (I/O) interface 22, the network interface 24, and/or the power source 26 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be generally referred to herein as "data processing circuitry." Such data processing circuitry may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 20 of the electronic device 10 may enable a user to interact with the electronic device 10 (e.g., pressing a button to increase or decrease a volume level). The I/O interface 22 may enable electronic device 10 to interface with various other electronic devices, as may the network interface 24. In some embodiments, the I/O interface 22 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 24 may include, for example, one or more interfaces for a personal area network (PAN), such as an ultra-wideband (UWB) or a BLUETOOTH® network, for a local area network (LAN) or wireless local area network (WLAN), such as a network employing one of the IEEE 522.11×family of protocols (e.g., WI-FED), and/or for a wide area network (WAN), such as any standards related to the Third Generation Partnership Project (3GPP), including, for example, a 3rd generation (3G) cellular network, universal mobile telecommunication system (UMTS), 4th generation (4G) cellular network, long term evolution (LTE®) cellular network, long term evolution license assisted access (LTE-LAA) cellular network, 5th generation (5G) cellular network, and/or New Radio (NR) cellular network, a satellite network, and so on. In particular, the network interface 24 may include, for example, one or more interfaces for using a Release-15 cellular communication standard of the 5G specifications that include the millimeter wave (mmWave) frequency range (e.g., 22.25-300 gigahertz (GHz)) and/or any other cellular communication standard release (e.g., Release-16, Release-17, any future releases) that define and/or enable frequency ranges used for wireless communication. The network interface 24 of the electronic device 10 may allow communication over the aforementioned networks (e.g., 5G, Wi-Fi, LTE-LAA, and so forth).

The network interface 24 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 24 may include a transceiver 28. In some embodiments, all or portions of the transceiver 28 may be disposed within the processor 12. The transceiver 28 may support transmission and receipt of various wireless signals via one or more antennas, and thus may include a transmitter and a receiver. The power source 26 of the electronic device 10 may include any suitable source of power, such as a rechargeable lithium polymer (Li-poly) battery and/or an alternating current (AC) power converter. In certain embodiments, the electronic device 10 may take the form of a computer, a portable electronic device, a wearable electronic device, or other type of electronic device.

Figure 2:
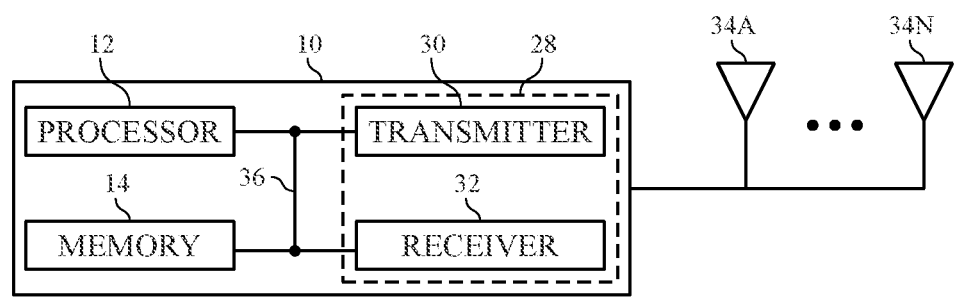
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 28, a transmitter 30, a receiver 32, and/or antennas 34 (illustrated as 34A-34N, collectively referred to as an antenna 34) may be communicatively coupled directly or indirectly (e.g., through or via another component, a communication bus, a network) to one another to transmit and/or receive data between one another.

The electronic device 10 may include the transmitter 30 and/or the receiver 32 that respectively enable transmission and reception of data between the electronic device 10 and an external device via, for example, a network (e.g., including base stations) or a direct connection. As illustrated, the transmitter 30 and the receiver 32 may be combined into the transceiver 28. The electronic device 10 may also have one or more antennas 34A-34N electrically coupled to the transceiver 28. The antennas 34A-34N may be configured in an omnidirectional or directional configuration, in a single-beam, dual-beam, or multi-beam arrangement, and so on. Each antenna 34 may be associated with a one or more beams and various configurations. In some embodiments, multiple antennas of the antennas 34A-34N of an antenna group or module may be communicatively coupled a respective transceiver 28 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 30 and the receiver 32 may transmit and receive information via other wired or wireline systems or means.

As illustrated, the various components of the electronic device 10 may be coupled together by a bus system 36. The bus system 36 may include a data bus, for example, as well as a power bus, a control signal bus, and a status signal bus, in addition to the data bus. The components of the electronic device 10 may be coupled together or accept or provide inputs to each other using some other mechanism.

Figure 3:
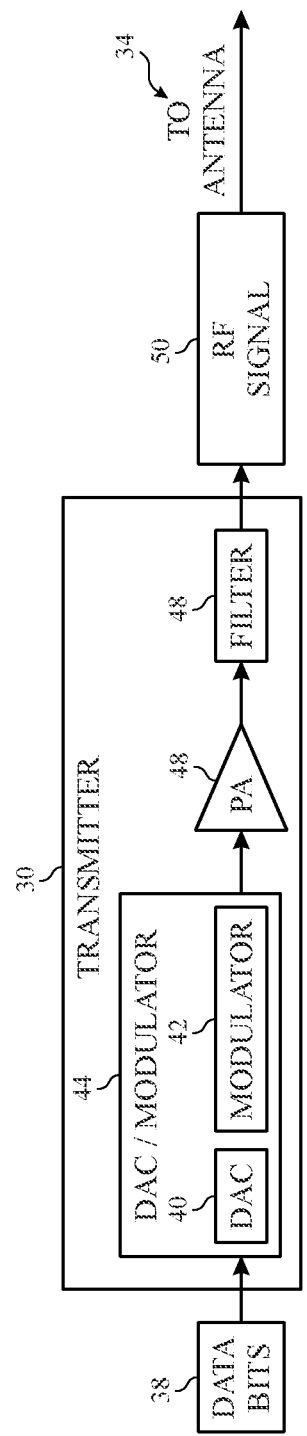
FIG. 3 is a schematic diagram of a transmitter of the electronic device of FIG. 1, according to embodiments of the present disclosure.

FIG. 3 is a schematic diagram of the transmitter 30 (e.g., transmit circuitry), according to embodiments of the present disclosure. As illustrated, the transmitter 30 may receive data bits 38 in the form of a digital signal to be transmitted via the one or more antennas 34. A digital-to-analog converter (DAC) 40 of the transmitter 30 may convert the digital signal to an analog signal, and a modulator 42 may combine the converted analog signal with a carrier signal to generate a radio wave. Additionally or alternatively, the DAC 40 and modulator 42 may be implemented together in a DAC/modulator 44. For example, the DAC/modulator 44 may convert the digital signal to the analog signal and combine the converted analog signal with the carrier signal simultaneously or concurrently and/or within the same circuitry. Moreover, the DAC 40, the modulator 42, and/or the DAC/modulator 44 may include or couple to a transformer, as will be appreciated.

Moreover, the DAC/modulator 44 may be implemented as multiple circuits (e.g., DAC 40 and modulator 42) coupled together or a singular combined circuit. In some embodiments, the DAC/modulator 44 may directly generate a modulated analog signal without first generating the converted analog signal. Furthermore, as used herein, a DAC 40 may refer to a standalone DAC 40 or a combined DAC/modulator 44, and an analog signal may refer to a converted analog signal or a modulated analog signal. Additionally, while embodiments are described herein as applying to RF signal generation, in some embodiments, aspects of the present disclosure may be applicable to other types or utilizations of DACs, such as a baseband DAC.

A power amplifier (PA) 46 receives the modulated signal from the modulator 42. The power amplifier 46 may amplify the modulated signal to a suitable level to drive transmission of the signal via the one or more antennas 34. A filter 48 (e.g., filter circuitry and/or software) of the transmitter 30 may then remove undesirable noise from the amplified signal to generate RF signal 50 to be transmitted via the one or more antennas 34. The filter 48 may include any suitable filter or filters to remove the undesirable noise from the amplified signal, such as a bandpass filter, a bandstop filter, a low pass filter, a high pass filter, and/or a decimation filter.

Additionally, the transmitter 30 may include any suitable additional components not shown, or may not include certain of the illustrated components, such that the transmitter 30 may transmit the data bits 38 via the one or more antennas 34. For example, the transmitter 30 may include a mixer and/or a digital up converter. As another example, the transmitter 30 may not include the filter 48 if the power amplifier 46 outputs the amplified signal in or approximately in a desired frequency range (such that filtering of the amplified signal may be unnecessary).

Figure 4:
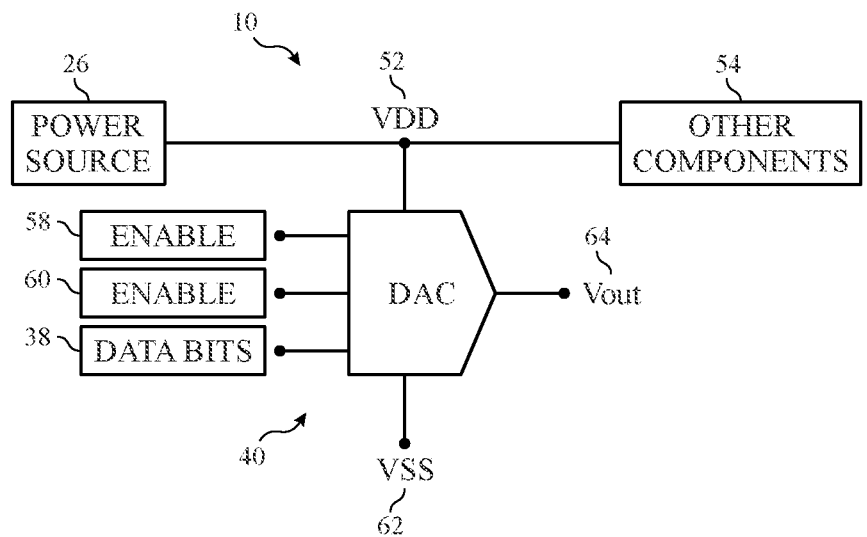
FIG. 4 is a schematic diagram of a portion of the electronic device of FIG. 1 including a digital-to-analog converter (DAC) of the transmitter of FIG. 3, in accordance with an embodiment of the present disclosure.

FIG. 4 is a schematic diagram of a portion of the transmitter 30 of the electronic device 10 having the DAC 40, according to an embodiment of the present disclosure. In some embodiments, the DAC 40 may share a supply or positive power voltage (e.g., VDD) 52 provided by the power source 26 with other components 54 of the transmitter 30 and/or the electronic device 10. For example, the other components 54 may include any powered electronic component of the transmitter 30 and/or the electronic device 10 utilizing the supply voltage 52 or a derivative thereof. Moreover, the DAC 40 may receive the data bits 38, an enable signal 58, and/or a complementary enable signal 60. The enable signal 58 and/or the complementary enable signal 60 may enable and/or facilitate enabling operation of the DAC 40.

For example, if the enable signal 58 is logically "low" relative to a reference voltage 62 (e.g., ground or other relative voltage), then the DAC 40 may be disabled or inactive (e.g., in a disable, inactive, or deactivated state). On the other hand, if the enable signal 58 is logically "high" (e.g., relative to the reference voltage 62 and/or the supply voltage 52), then the DAC 40 may be enabled or active for operation (e.g., in an enabled or activated state). Furthermore, the reference voltage 62 (e.g., VSS) may be provided as a reference for the data bits 38, the enable signal 58, the complementary enable signal 60, the supply voltage 52, and/or the RF signal 50 (e.g., an analog output signal). As should be appreciated, and as used herein, signals (e.g., the data bits 38, the enable signal 58, the complementary enable signal 60, the RF signal 50, etc.) may correspond to voltages and/or currents relative to a reference and may represent electronically storable, displayable, and/or transmittable data.

The analog output signal 64 generated by the DAC 40 may correspond to values of the data bits 38 to provide the RF signal 50. For example, the PA 46, the filter 48, and/or other viable circuits may receive the analog output signal 64 of the DAC 40 to provide the RF signal 50. The data bits 38 and the corresponding RF signal 50 may be associated with any suitable bit-depth depending on implementation. For example, in the context of image data (e.g., in a baseband DAC) and/or signal transmission data (e.g., in an RF DAC), an 8-bit data bits 38 may correspond to 255 or 256 analog output signal 64.

In some embodiments, the transmitter 30 may provide the RF signal 50 over a broadband frequency range (e.g., 0.7 GHz to 7 GHz) spanning wider than a transmission frequency range (0.7 GHz to 1.9 GHz, 2 GHz to 2.6 GHz, and so on) of the DAC 40. In such cases, the transmitter may include multiple DACs 40 with different transmission frequency ranges. For example, each of the DACs 40 may provide the analog output signal 64 with transmission frequencies within different transmission frequency ranges (overlapping or non-overlapping transmission frequency ranges) to cover the scope of the broadband frequency range associated with the RF signal 50. For example, although one DAC 40 is shown in the depicted embodiments of FIGS. 2 and 3, on some embodiments, the transmitter 30 may include multiple DACs 40 each providing the RF signal 50 with transmission frequencies within a different transmission frequency range (e.g., 0.7 GHz to 1.9 GHz, 1.9 to 2.6 GHz, and so on).

In some cases, each of the DACs 40 may provide the analog output signal 64 to a respective transformer to convert an impedance for providing the analog output signal 64. The transformer may include an impedance tuning circuit to adjust/tune an output impedance (e.g., reactance) for providing the analog output signal 64 to shift a center frequency of transmitting the RF signal 50 to select a transmission frequency range for providing the RF signal 50. In specific cases, the respective transformers may also amplify the analog output signal 64 or otherwise condition the analog output signal 64 for subsequent circuits of the transmitter 30.

With the foregoing in mind, DACs 40 with wide transmission frequency ranges are desired to cover the scope of the broadband frequency range with a reduced number electrical components. In particular, implementing the DACs 40 with the wide (and different) transmission frequency ranges in the transmitter 30 may reduce a total number of DACs for covering the scope of the broadband frequency range. Accordingly, in some cases, implementing a reduced number of the DACs 40 with wide transmission frequency ranges may reduce a cost of production of the transmitter 30 based on a reduced occupied space and/or footprint of a component (e.g., the transmitter 30).

In any case, each DAC 40 may have a relatively fixed and/or narrow transmission frequency range at each time based on a relationship between an output impedance of the respective DAC 40 and an input impedance of the one or more antennas 34. The fixed and/or narrow transmission frequency is in comparison with the wide transmission frequency range, as mentioned above and discussed in more details below. Moreover, in different cases, the relationship may include a matching, approximately matching, relatively matching, and/or controlled mismatch between the output impedance of a DAC 40 and an input impedance of the one or more antennas 34.

As mentioned above, an input impedance of the one or more antennas 34 may be relatively (and/or approximately) constant. As such, adjusting the output impedance of the DACs 40 may shift or adjust (e.g., increase or decrease) the relatively fixed and/or narrow transmission frequency range of the DACs 40. Accordingly, to provide the wide transmission frequency range by a DAC 40, the DAC 40 may include circuitry for adjusting the output impedance (e.g., resistance, reactance, or both) of the DAC 40. For example, the DAC 40 may receive one or more control signals selecting a desired transmission frequency range (e.g., a relatively fixed and/or narrow transmission frequency range) of the DAC 40 by adjusting the output impedance of the DAC 40.

Figure 5:
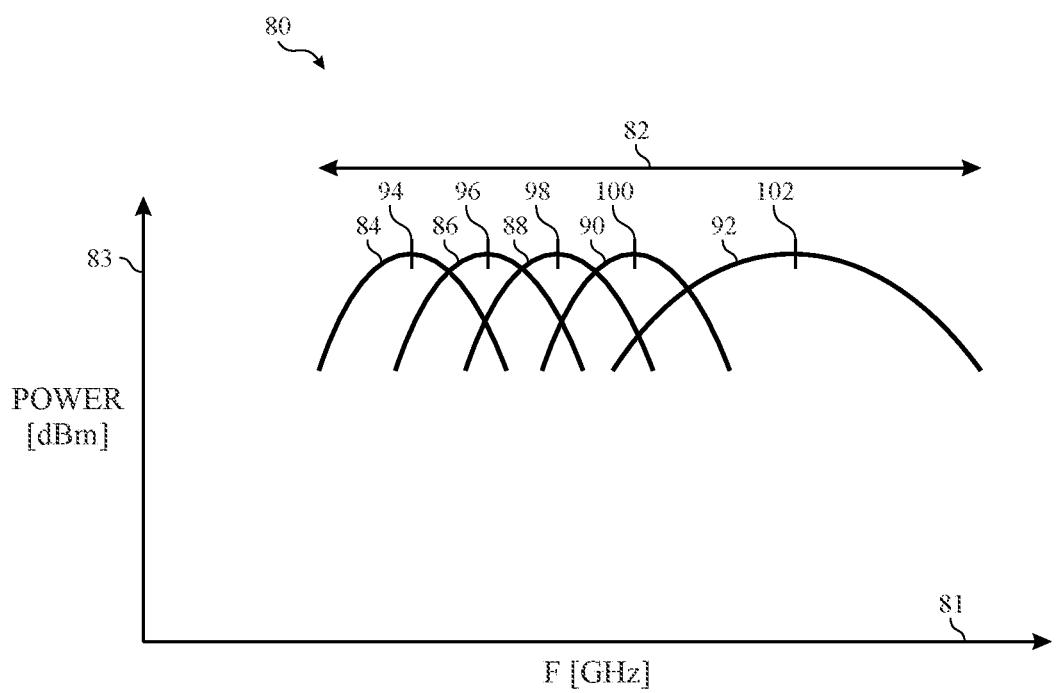
FIG. 5 is a graph of a wide transmission frequency range including multiple transmission frequency subranges associated with DAC of FIGS. 3 and 4, in accordance with an embodiment of the present disclosure.

FIG. 5 is a graph 80 depicting a wide transmission frequency range 82 associated with the electronic device 10 over a frequency axis 81 (e.g., in gigahertz (GHz)) and a power axis 83 (e.g., in decibel milliwatts (dBm)). For example, the DAC 40 may couple to a transformer including the impedance tuning circuit to provide the analog output signal 64 over the wide transmission frequency range. In the depicted embodiment, the wide transmission frequency range 82 includes a first transmission frequency range 84, a second transmission frequency range 86, a third transmission frequency range 88, a fourth transmission frequency range 90, and a fifth transmission frequency range 92. However, in other embodiments, the DAC 40 may have the wide transmission frequency range 82 with a different number of transmission frequency sub-ranges.

As mentioned above, the DAC 40 may couple to (or in specific embodiments include) the transformer to select each of the first, the second, the third, the fourth, and the fifth transmission frequency ranges 84, 86, 88, 90, and 92 by shifting a center frequency for providing the analog output signal 64 to provide the RF signal 50. Each of the first, the second, the third, the fourth, and the fifth transmission frequency ranges 84, 86, 88, 90, and 92 are distributed about a respective center frequency 94, 96, 98, 100, and 102. The impedance tuning circuit of the transformer may receive one or more control signals to adjust an output impedance for providing the analog output signal 64 of the DAC 40 to shift the center frequency for providing the RF signal 50. Accordingly, the electronic device 10 may provide the RF signal 50 with a transmission frequency within one of the first, the second, the third, the fourth, or the fifth transmission frequency ranges 84, 86, 88, 90, or 92.

The impedance tuning circuit may include a number of auxiliary inductors and capacitors to adjust/tune the output impedance for providing the analog output signal 64. In one non-limiting example, the third transmission frequency range 88 distributed around the center frequency 98 may correspond to a normal operation of the DAC 40 without employing an auxiliary inductance or auxiliary capacitance. The second transmission frequency range 86 distributed around the center frequency 96 may correspond to the frequency range of the analog output signal 64 when the DAC 40 is selectively coupled to a first auxiliary inductor of the impedance tuning circuit. Moreover, the first transmission frequency range 84 distributed around the center frequency 94 may correspond to the frequency range of the analog output signal 64 when the DAC 40 is selectively coupled to a second auxiliary inductor with a higher inductance value than that of the first auxiliary inductor of the impedance tuning circuit.

The fourth transmission frequency range 90 distributed around the center frequency 100 may correspond to the frequency range of the analog output signal 64 when the DAC 40 is selectively coupled to a first auxiliary capacitor of the impedance tuning circuit. Moreover, the fifth transmission frequency range 92 distributed around the center frequency 102 may correspond to the frequency range of the analog output signal 64 when the DAC 40 is selectively coupled to a second auxiliary capacitor with a higher capacitance value than that of the first auxiliary capacitor of the impedance tuning circuit. Different embodiments related to such example is explained in more details below with respect to FIGS. 6-10. It should be appreciated that in alternative or additional embodiments, the wide transmission frequency range 82 may include a different number of auxiliary inductors and/or auxiliary capacitors to provide additional or reduced number of transmission frequency ranges.

In any case, in different embodiments, the first, the second, the third, the fourth, and the fifth transmission frequency ranges 84, 86, 88, 90, and 92 may have similar or different bandwidths. For example, in the depicted embodiment, the fifth transmission frequency range 92 may have a bandwidth wider than the first, the second, the third, and the fourth transmission frequency ranges 84, 86, 88, and 90. Moreover, each of the first, the second, the third, the fourth, and the fifth transmission frequency ranges 84, 86, 88, 90, and 92 may or may not be overlapping. In any case, the wide transmission frequency range 82 includes a wider bandwidth for providing the RF signal 50 compared to each of the first, the second, the third, the fourth, and the fifth transmission frequency ranges 84, 86, 88, 90, and 92.

In one non-limiting example, the first transmission frequency range 84 may have a bandwidth of 0.7 GHz to 1.9 GHz, the second transmission frequency range 86 may have a bandwidth of 1.9 GHz to 2.6 GHz, the third transmission frequency range 88 may have a bandwidth of 2.6 GHz to 3.6 GHz, the fourth transmission frequency range 90 may have a bandwidth of 3.6 GHz to 5.6 GHz, and the fifth transmission frequency range 92 may have a bandwidth of 5.6 GHz to 8.6 GHz. Accordingly, in the example above, the wide transmission frequency range 82 may have a total bandwidth of 0.7 GHz to 8.6 GHz. However, it should be appreciated that in different embodiments, each of the first, the second, the third, the fourth, and the fifth transmission frequency ranges 84, 86, 88, 90, and 92, and also the wide transmission frequency range 82, may have a different bandwidth.

With the foregoing in mind, in some embodiments, the electronic device 10 having the first, the second, the third, the fourth, and the fifth transmission frequency ranges 84, 86, 88, 90, and 92 may provide the RF signal 50 with improved output power (e.g., above 10 dBm, 12 dBm, 14 dBm, 16 dBm, 18 dBm, and so on) and/or improved power consumption efficiency. For example, the output power and/or the power consumption efficiency of the DAC 40 may improve as a transmission frequency of the analog output signal 64, and therefore the RF signal 50, becomes closer to the center frequency 94, 96, 98, 100, or 102 of a selected transmission frequency range. As such, in some cases, the impedance tuning circuit may receive the one or more control signals to select a transmission frequency range (e.g., the first, the second, the third, the fourth, and the fifth transmission frequency ranges 84, 86, 88, 90, or 92) for providing the analog output signal 64 with the closest center frequency 94, 96, 98, 100, or 102 to the transmission frequency of the RF signal 50. Accordingly, in such cases, the power gain and/or the power consumption efficiency of the DAC 40 may improve.

Figure 6:
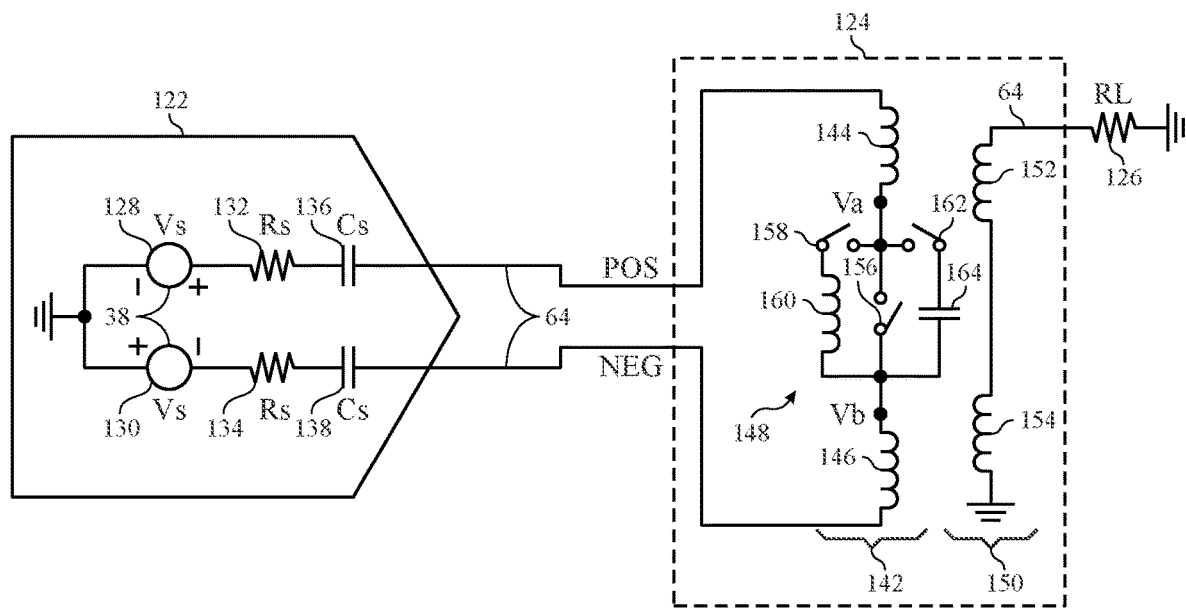
FIG. 6 is a circuit diagram of an embodiment of the DAC of FIGS. 3 and 4 with an adjustable output reactance to provide the wide transmission frequency range of FIG. 5, in accordance with an embodiment of the present disclosure.

FIG. 6 is a circuit diagram of a first embodiment of the DAC 40 with adjustable output reactance. In the depicted embodiment, the DAC 40 may be coupled to a transformer 124, and a load (RL) 126. For example, the load 126 may include (or correspond to) the PA 46, the filter 48, the one or more antennas 34, and/or any other downstream circuit component. For example, the load 126 may include a resistance of 50Ω (e.g., approximately 50Ω, though in alternative embodiments, the load 126 may include any suitable resistance. The transformer 124 may include an impedance tuning circuit 148 for tuning a reactance associated with providing the analog output signal 64. As discussed above, tuning an output reactance of the impedance tuning circuit 148 of the transformer 124 may shift the center frequency to select a transmission frequency range for providing the analog output signal 64 and therefore the RF signal 50.

The DAC 40 may receive the bit stream 38 from one or more circuit components of the electronic device 10. Moreover, in the depicted embodiment, the DAC 40 may provide the RF signal 50 based on receiving the bit stream 38 in differential form. For example, voltage supplies ($V_S$) 128 and 130 of the DAC 40 may represent a positive and a negative portions of the differential bit stream 38 respectively. Moreover, resistors ($R_S$) 132 and 134 and capacitors ($C_S$) 136 and 138 of the DAC 40 may condition the received bit stream 38 before generating the analog output signal 64. Conditioning may refer to preparation of the received bit stream 38 to provide the analog output signal 64 with a desired amplitude, frequency, delay, and/or impedance to the transformer 124. The DAC 40 may then provide the analog output signal 64 to the transformer 124 for providing the analog output signal 64 with an adjusted output reactance. Furthermore, it should be appreciated that the depicted embodiment of the DAC 40 is provided as an example and, in different embodiments, the DAC 40 may include different circuitry and/or different equalizer circuitry.

In any case, a first portion 142 of the transformer 124 may receive the analog output signal 64. The first portion 142 includes a first inductor 144, a second inductor 146, and the impedance tuning circuit 148. The impedance tuning circuit 148 may receive one or more control signals to tune or adjust an output reactance of the transformer 124 to select the transmission frequency range for providing the analog output signal 64 and therefore the RF signal 50. In some cases, the first inductor 144 and the second inductor 146 may have a similar inductance (e.g., relatively similar, approximately similar) about the impedance tuning circuit 148 to provide a better balanced analog output signal 64.

Moreover, a second portion 150 of the transformer 124 may include a third inductor 152 and a fourth inductor 154. The first inductor 144 of the first portion 142 may inductively couple to the third inductor 152 of the second portion 150 when the first inductor 144 is receiving the analog output signal 64. Moreover, the second inductor 146 of the first portion 142 may inductively couple to the fourth inductor 154 of the second portion 150 when the second inductor 146 is receiving the analog output signal 64. Each of the first inductor 144, the second inductor 146, the third inductor 152, and the fourth inductor 154 may have a number of windings. The number of windings of each of the inductors 144, 146, 152, and 154 may be based on a desired frequency for providing the analog output signal 64, an amplification factor for amplifying an amplitude of the analog output signal 64, a stability of the analog output signal 64, among other things.

The impedance tuning circuit 148 may include a first switch 156 to provide or remove a conductive path between the first inductor 144 and the third inductor 152 of the first portion 142. Moreover, the impedance tuning circuit 148 may include a second switch 158 coupled in series to an auxiliary inductor 160 such that the second switch 158 and the auxiliary inductor 160 are coupled in parallel to the first switch 156. The impedance tuning circuit 148 may also include a third switch 162 coupled in series to an auxiliary capacitor 164. The third switch 162 and the auxiliary capacitor 164 may be coupled in parallel to the first switch 156 and the second switch 158 and the auxiliary inductor 160. In the depicted embodiment, the impedance tuning circuit 148 may receive the control signals to close the first switch 156, the second switch 158, or the third switch 162. For example, the processor 12 of FIG. 1 may provide the control signals to select the transmission frequency range for providing the RF signal 50.

In a first case, the processor 12 may provide the control signals to close the first switch 156. In the first case, the first switch 156 may close to couple the first inductor 144 in series to the second inductor 146 in response to receiving the control signals. Closing the first switch 156 may facilitate providing the RF signal 50 to the one or more antennas 34 with a first output reactance when the DAC 40 receives the bit stream 38. A combination of inductances of the first inductor 144 and the third inductor 152, the second inductor 146 and the fourth inductor 154, as well as the capacitance of the capacitors 136 and 138 may correspond to a value of the first output reactance. In some cases, additional capacitance and/or inductances, such as parasitic capacitances and/or inductances of the DAC 40, may also contribute to (e.g., increase or decrease) the value of the first output reactance. The first output reactance is associated with the transformer 124, the DAC 40, and/or the transmitter 30 when providing the analog output signal 64 to one or more subsequent circuit components (e.g., the PA 46, the filter 48, and/or the one or more antennas 34).

As mentioned above, a center frequency and a corresponding transmission frequency range for providing the analog output signal 64 (and/or the RF signal 50) are based on an output reactance of the transformer 124 (and/or the transmitter 30). As such, the first output reactance of the transformer 124 may correspond to a first transmission frequency range with a first center frequency. For example, the first transmission frequency range may correspond to one of the first, the second, the third, the fourth, and the fifth transmission frequency ranges 84, 86, 88, 90, and 92 described above with respect to FIG. 5.

In a second case, the processor 12 may provide the control signals to close the second switch 158. In the second case, the second switch 158 may close to couple the auxiliary inductor 160 in series with the first inductor 144 and the second inductor 146 in response to receiving the control signals. As such, the auxiliary inductor 160 may increase the output reactance of the transformer 124, the DAC 40, and/or the transmitter 30 based on an inductance value of the auxiliary inductor 160. For example, closing the second switch 158 may facilitate providing the RF signal 50 to one or more subsequent circuit components (e.g., the PA 46, the filter 48, and/or the one or more antennas 34) with a second output reactance when the DAC 40 receives the bit stream 38. The second output reactance may have an increased value compared to the first output reactance based on the inductance value of the auxiliary inductor 160.

Moreover, the second output reactance of the transformer 124 may correspond to a second transmission frequency range of the DAC 40 with a second center frequency for providing the analog output signal 64 (and/or the RF signal 50). For example, the impedance value of the auxiliary inductor 160 may cause a shift in the first center frequency to a lower frequency (e.g., decrease) to the second center frequency. Accordingly, closing the second switch 158 and coupling the auxiliary inductor 160 in series with the first inductor 144 and the second inductor 146 may shift the first transmission frequency range with the first center frequency lower to the second transmission frequency range and the second center frequency.

In a third case, the processor 12 may provide the control signals to close the third switch 162. In the third case, the third switch 162 may close to couple the auxiliary capacitor 164 in series with the first inductor 144 and the second inductor 146 in response to receiving the control signals. As such, the auxiliary capacitor 164 may decrease the output reactance of the transformer 124, the DAC 40, and/or the transmitter 30 based on a capacitance value of the auxiliary capacitor 164. For example, closing the third switch 162 may facilitate providing the analog output signal 64 (and/or the RF signal 50) to the one or more antennas 34 with a third output reactance when the DAC 40 receives the bit stream 38. The third output reactance may have a decreased value compared to the first output reactance based on the capacitance value of the auxiliary inductor 160.

Moreover, the third output reactance of the transformer 124 may correspond to a third transmission frequency range of the DAC 40 with a third center frequency for providing the analog output signal 64 (and/or the RF signal 50). For example, the capacitance value of the auxiliary capacitor 164 may cause a shift in the first center frequency to a higher frequency (e.g., increase) to the third center frequency. Accordingly, closing the third switch 162 and coupling the auxiliary capacitor 164 in series with the first inductor 144 and the second inductor 146 may shift the first transmission frequency range and the first center frequency higher to the third transmission frequency range and the third center frequency.

Figure 7:
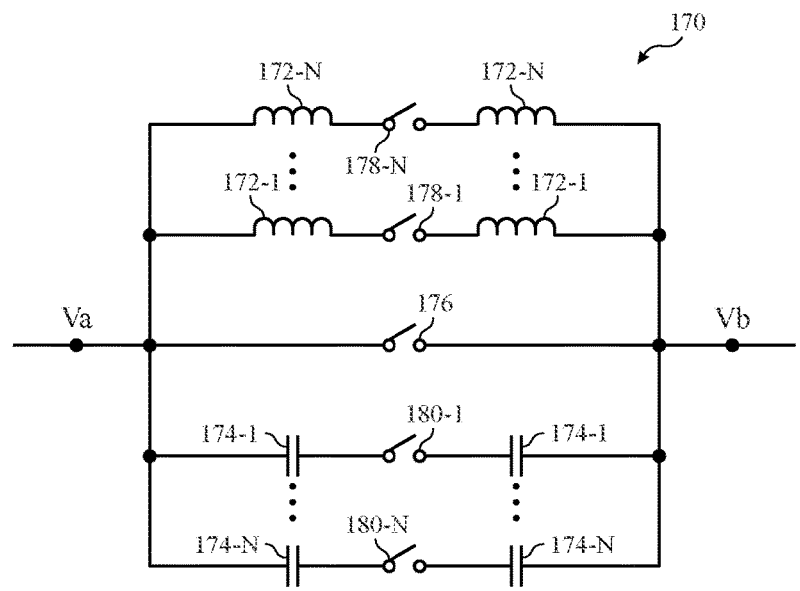
FIG. 7 is a circuit diagram of an impedance tuning circuit that may be implemented with the DAC of FIG. 6 to provide the adjustable output reactance, in accordance with an embodiment of the present disclosure.

With the foregoing in mind, the impedance tuning circuit 148 of FIG. 6 is provided by way of example and, in different embodiments, different variations of the impedance tuning circuit 148 may be implemented. For example, FIG. 7 is a circuit diagram depicting an impedance tuning circuit 170 including a number of auxiliary inductors 172-1-172-N and a number of auxiliary capacitors 174-1-174-N. Moreover, as shown in the depicted embodiment, the impedance tuning circuit 170 is scalable to include any suitable number of auxiliary inductors 172-1-172-N and/or auxiliary capacitors 174-1-174-N.

A switch 176 may provide a conductive path to bypass the auxiliary inductors 172-1-172-N and/or auxiliary capacitors 174-1-174-N. Moreover, in the depicted embodiment, the auxiliary inductors 172-1-172-N and the auxiliary capacitors 174-1-174-N are shown in pairs and are disposed on both sides of switches 178-1-178-N and 180-1-180-N respectively. Accordingly, the switches 178-0-178-N and the switches 180-0-180-N may provide improved balance for tuning the output reactance of the transformer 124 for providing the analog output signal 64.

In any case, each of the auxiliary inductors 172-1-172-N may have a different inductance value. Moreover, each of the auxiliary capacitors 174-1-174-N may have a different capacitance value. Furthermore, the impedance tuning circuit 170 may receive one or more control signals to close one or more of the switches 176, 178-0-178-N, and/or 180-1-180-N. For example, in some embodiments, the transformer 124 of FIG. 6 may include the impedance tuning circuit 170 of FIG. 7 on the first portion 142. In such embodiments, the impedance tuning circuit 170 may couple one or more of the auxiliary inductors 172-1-172-N and/or the auxiliary capacitors 174-1-174-N to the first portion 142. For example, selecting an auxiliary inductor of the auxiliary inductors 172-1-172-N with higher inductance may provide a lower shift of the center frequency and selecting an auxiliary capacitor of the auxiliary capacitors 174-1-174-N with higher capacitance may provide a higher shift of the center frequency.

In alternative or additional embodiments, the second portion 150 of the transformer of FIG. 6 may also include the impedance tuning circuit 170 (and/or the impedance tuning circuit 148 described above). Nevertheless, the impedance tuning circuit 148 may tune the output reactance of the transformer 124 with more granularity based on the number of auxiliary inductors 172-1-172-N and the number of auxiliary capacitors 174-1-174-N. Accordingly, the processor 12 (or any other viable circuit) may provide the control signals selecting the transmission frequency range for transmission of the analog output signal 64 (and/or the RF signal 50) based on shifting the center frequency (compared to the first center frequency described above with respect to FIG. 5) with more levels of granularity.

Figure 8:
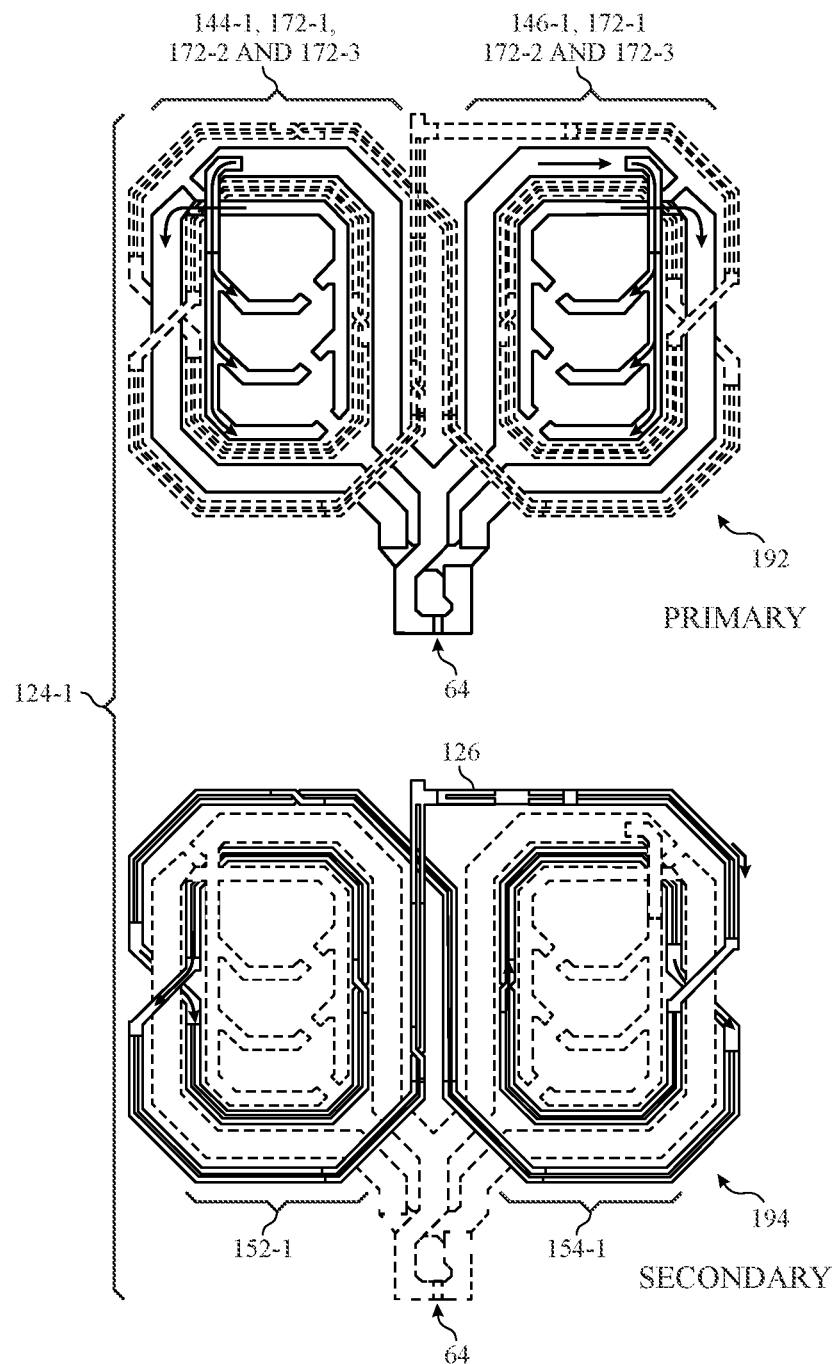
FIG. 8 is a first layout of a transformer of the DAC of FIG. 6 with a first winding configuration that may include the impedance tuning circuit of FIG. 7, in accordance with an embodiment of the present disclosure.
Figure 9:
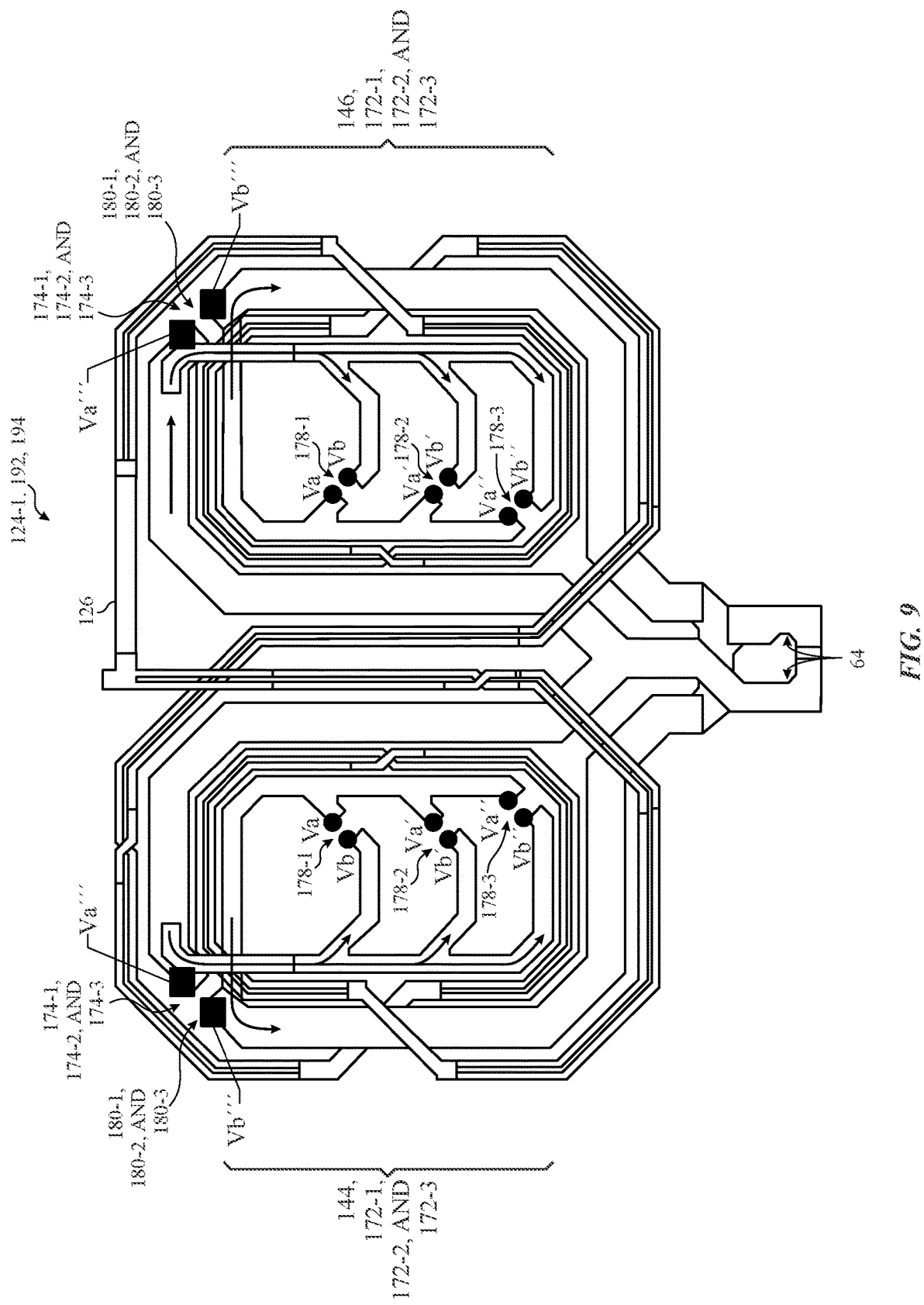
FIG. 9 is a detailed view of the first layout of the transformer of FIG. 8, in accordance with an embodiment of the present disclosure.
Figure 10:
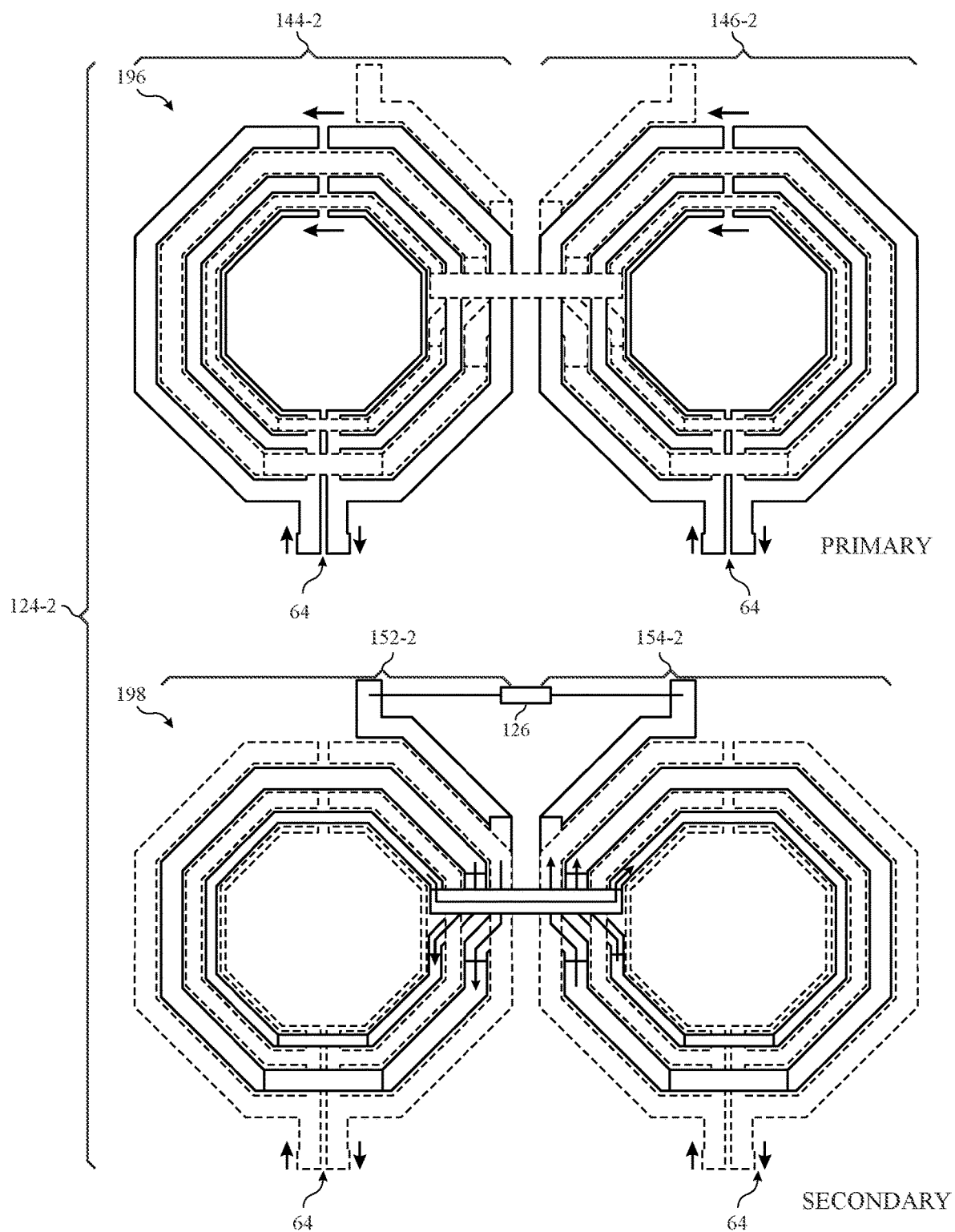
FIG. 10 is a second layout of the transformer of the DAC of FIG. 6 with a second winding configuration that may include the impedance tuning circuit of FIG. 7, in accordance with an embodiment of the present disclosure.
Figure 11:
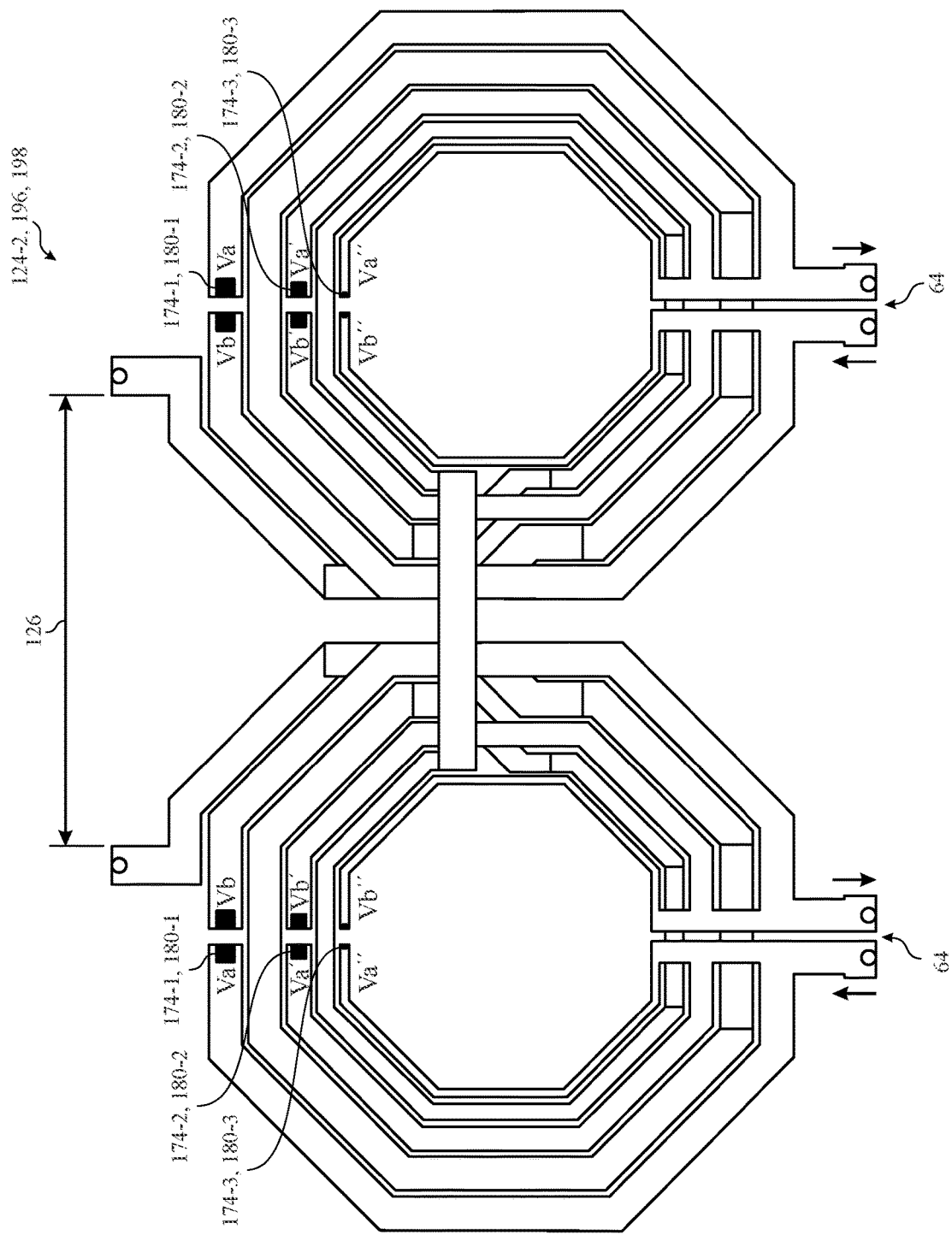
FIG. 11 is a detailed view of the second layout of the transformer of FIG. 10, in accordance with an embodiment of the present disclosure.

With the foregoing in mind, FIGS. 8 and 9 depict a first layouts of a transformer 124-1 and FIGS. 10 and 11 depict a second layout of a transformer 124-2 with a wide transmission frequency range (e.g., the wide transmission frequency range 82 of FIG. 5 described above). The transformers 124-1 and 124-2 may each include various metals, amorphous metals, and/or alloys that may have magnetic (e.g., ferromagnetic) properties. Accordingly, the transformers 124-1 and 124-2 may each include the impedance tuning circuit 148 or 170 described above.

In any case, FIG. 8 depicts a primary portion 192 and a secondary portion 194 of the transformer 124-1. Moreover, FIG. 9 provides an overlaid depiction of the primary portion 192 and the secondary portion 194. For example, the primary portion 192 may include the first portion 142 of the transformer 124-1. As shown in FIGS. 8 and 9, the primary portion 192 may include two mirrored subportions to receive the analog output signal 64 (e.g., differential DAC signal) and induce the electrical current of the analog output signal 64 to the secondary portion 194. The mirrored subportions may at least partially cancel undesired electromagnetic fields of the circular windings of the primary portion 192 to reduce an impact of the undesired electromagnetic fields when transferring the electrical currents to the secondary portion 194.

By the way of example, each of the two mirrored subportions may receive the analog output signal 64 to provide the inductance values of the inductors 144 and 146, respectively. Moreover, the primary portion 192 may include three auxiliary inductors 172-1, 172-2, and 172-3 provided by a number of turns of winding that are selectable by closing the switches 178-1, 178-2, and 178-3 respectively. The number and/or size of the windings may correspond to an inductance value of each of the selectable auxiliary inductors 172-1, 172-2, or 172-3. In different embodiments, the windings may take different shapes and forms. As mentioned above, the processor 12 may provide the control signals to close one or more of the switches 178-1, 178-2, or 178-3. Furthermore, the primary portion 192 may also include three auxiliary capacitors 174-1, 174-2, and 174-3 that are selectable by closing the switches 180-1, 180-2, and 180-3 respectively. Similarly, the processor 12 may provide the control signals to close one or more of the switches 180-1, 180-2, or 180-3.

Moreover, the secondary portion 194 may include the second portion 150 of the transformer 124-1. Similarly, the secondary portion 194 may include mirrored subportions to at least partially cancel undesired electromagnetic fields of the circular windings of the secondary portion 194 to reduce impacts of the undesired electromagnetic fields when receiving the electrical currents from the primary portion 192. Moreover, in alternative or additional embodiments, the transformer 124-1 may include additional or a reduced number of auxiliary inductors, auxiliary capacitors, and/or switches.

In FIG. 10, a direction of current flow in a primary portion 196 and a secondary portion 198 of the transformer 124-2 are shown in clock in clock-wise and counter clock-wise directions. Moreover, FIG. 11 provides an overlaid depiction of the primary portion 196 and the secondary portion 198. For example, the primary portion 196 may include the first portion 142 of the transformer 124-2. As shown in FIGS. 10 and 11, the primary portion 196 may include two mirrored subportions to receive the analog output signal 64 and induce the electrical current of the analog output signal 64 to the secondary portion 198. Similar to the first layouts of the transformer 124-1 shown in FIGS. 8 and 9, the mirrored subportions may at least partially cancel undesired electromagnetic fields of the circular windings of the primary portion 196 to reduce an impact of the undesired electromagnetic fields when transferring the electrical currents to the secondary portion 198.

By the way of example, each of the two mirrored subportions may receive the analog output signal 64 to provide the inductance values of the inductors 144 and 146, respectively. Moreover, the primary portion 196 and the secondary portion 198 may include a number of turns of windings. The number and/or size of the windings may correspond to a respective inductance value of the primary portion 196 and the secondary portion 198. In different embodiments, the windings may take different shapes and forms. Referring now to FIG. 11, the primary portion 196 of the transformer 124-2 may also include three auxiliary capacitors 174-1, 174-2, and 174-3 that are selectable by closing the switches 180-1, 180-2, and 180-3 respectively. The processor 12 may provide the control signals to close one or more of the switches 180-1, 180-2, or 180-3.

Moreover, the secondary portion 198 of the transformer 124-2 may include the second portion 150 of the transformer 124-2. Similarly, the secondary portion 198 may include mirrored subportions to at least partially cancel undesired electromagnetic fields of the circular windings of the secondary portion 198 to reduce impacts of the undesired electromagnetic fields when receiving the electrical currents from the primary portion 196. Moreover, in alternative or additional embodiments, the transformer 124-2 may include additional or a reduced number of auxiliary inductors, auxiliary capacitors, and/or switches. In any case, it should be appreciated that the transformers 124-1 and 124-2 shown in FIGS. 8-11 are provided as an example. Accordingly, in different embodiments, the transformers 124-1 or 124-2 may include the layout shown in FIGS. 8-11 or any other viable layout to include an impedance tuning circuit (e.g., the impedance tuning circuit 148, the impedance tuning circuit 170, among other viable impedance tuning circuits).

Figure 12:
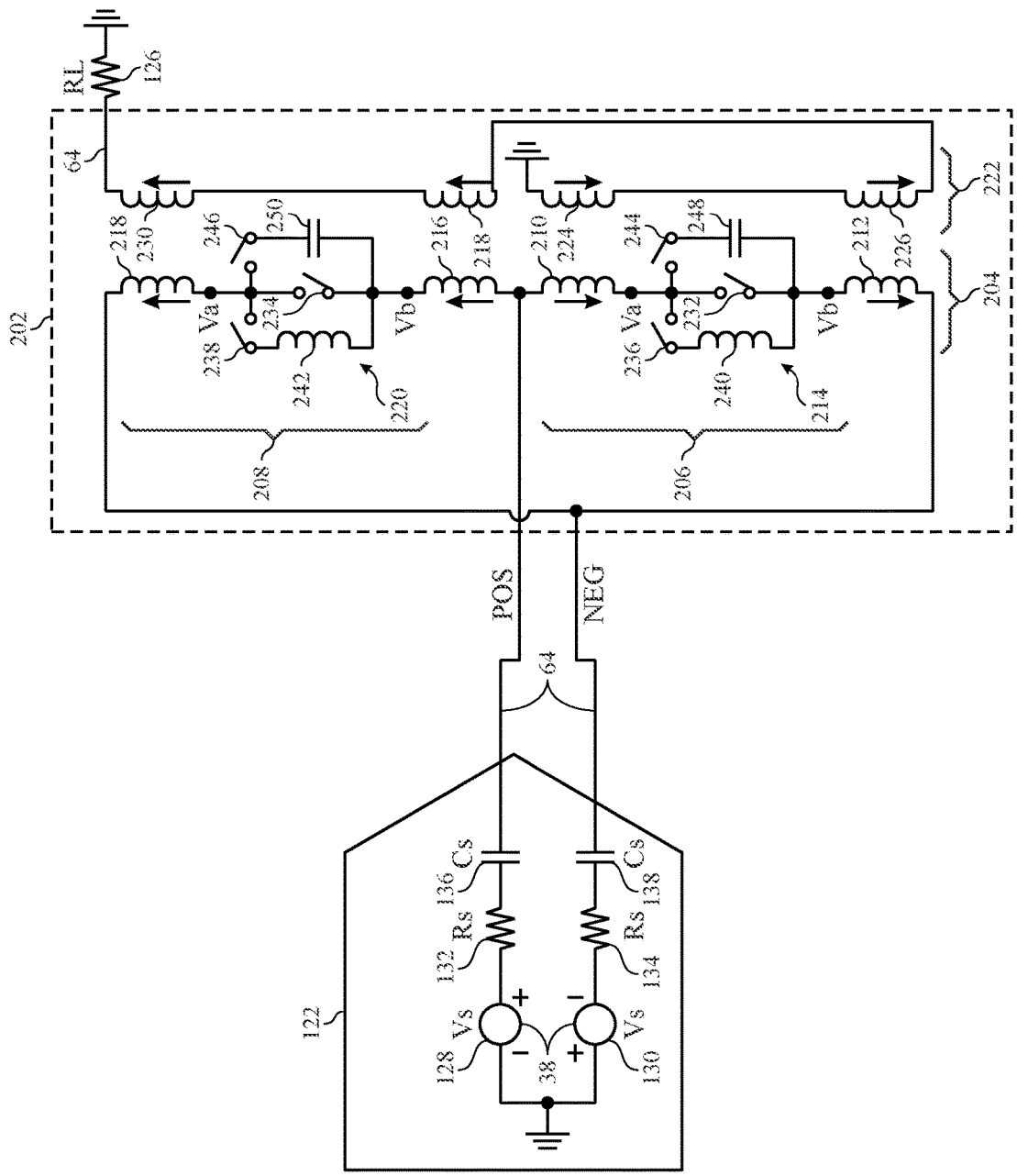
FIG. 12 is a circuit diagram of another embodiment of the DAC of FIGS. 3 and 4 including a differential transformer with an adjustable output reactance to provide the wide transmission frequency range of FIG. 5, in accordance with an embodiment of the present disclosure.

FIG. 12 is a circuit diagram of a second embodiment of the DAC 40 with adjustable output reactance. The DAC 40 may couple to a transformer 202 coupled to the load 126. In some cases, the transformer 202 may be implemented using a layout at least partially similar to the layout of the transformer 124-1 or 124-2 shown in FIGS. 8-11 above. In the depicted embodiment, a first portion 204 of the transformer 202 may include a first branch 206 and a second branch 208. The first branch 206 and the second branch 208 are coupled to the DAC 40 in parallel to receive the conditioned data bits 140. The first branch 206 may include a first inductor 210, a second inductor 212, and a first impedance tuning circuit 214. Moreover, the second branch 208 may include a third inductor 216, a fourth inductor 218, and a second impedance tuning circuit 220. In some cases, the components of the first branch 206 and the second branch 208 may have similar (e.g., identical, approximately identical) values to perform operations in parallel for providing the analog output signal 64 (and/or the RF signal 50) with a desired output reactance.

The second portion 222 of the transformer 202 may include a fifth inductor 224, a sixth inductor 226, a seventh inductor 228, and an eighth inductor 230 coupled in series. In some cases, the fifth inductor 224, the sixth inductor 226, the seventh inductor 228, and the eighth inductor 230 may have similar (e.g., approximately similar, relatively similar) inductance values to provide the analog output signal 64 (and/or the RF signal 50). Moreover, in some cases, the first inductor 210 of the first branch 206 and the third inductor 216 of the second branch 208 may have similar inductance values to provide more robust balance when providing the analog output signal 64. Similarly, in some cases, the second inductor 146 of the first branch 206 and the fourth inductor 218 of the second branch 208 may have similar inductance values. Furthermore, in specific cases, to provide the more robust balance when providing the analog output signal 64 based on receiving the differential conditioned data bits 38, the first inductor 210 and the second inductor 212 of the first branch 206 and the third inductor 216 and the fourth inductor 218 of the second branch 208 may have similar inductance values.

In any case, when receiving the analog output signal 64 differentially from the DAC 40, electrical current may traverse from the first inductor 210 to the fifth inductor 224, the second inductor 212 to the sixth inductor 226, the third inductor 216 to the seventh inductor 228, and the fourth inductor 218 to the eighth inductor 230 to generate respective analog signals to provide the analog output signal 64 with a desired output impedance. In some cases, the transformer 202 may also amplify a voltage of the analog output signal 64. The fifth inductor 224, the sixth inductor 226, the seventh inductor 228, and the eighth inductor 230 may combine the respective generated analog signals based on being coupled in series to provide the analog output signal 64 to the load 126.

In some cases, at least some of the inductors 210, 212, 216, 218, 224, 226, 228, and 230 of the transformer 202 may have a smaller number of windings compared to the inductors 144, 146, 152, and 154 of the transformer 124 of FIG. 5 described above. For example, generating the RF signal 50 (e.g., with a target voltage amplitude) based on using the parallel first branch 206 and second branch 208 of the transformer 202 may provide for a reduced ratio of windings of the inductor pairs 210 and 224, 212 and 226, 216 and 228, and 218 and 230 (e.g., 1:2.5, 1:4, 1:5, etc.) compared to windings of the inductor pairs 144 and 152 and 146 and 154 of the transformer 124 (e.g., 1:7, etc.) of FIG. 5 described above. Accordingly, the second embodiment depicted in FIG. 12 and described herein may have a reduced parasitic capacitance and/or parasitic inductance (desirable) based on the smaller number of windings. Moreover, although the second embodiment of the transformer 202 includes the first branch 206 and the second branch 208 on the first portion 204, in alternative or additional cases, the transformer 202 may include additional parallel branches (e.g., a third branch, a fourth branch, and so on). In such cases, at least some inductors of the transformer 202 may have even smaller number of windings based on a further reduced ratio of windings for providing the analog output signal 64.

With the foregoing in mind, the first impedance tuning circuit 214 and the second impedance tuning circuit 220 may receive one or more control signals to adjust an output reactance of the transformer 202, and therefore, an output reactance for providing the analog output signal 64. Similar to the impedance tuning circuit 148 of FIG. 6, the first impedance tuning circuit 214 and the second impedance tuning circuit 220 may each include a first switch 232 and 234 respectively. The first switches 232 and 234 may provide a conductive path between the first inductor 210 and the second inductor 212 and between the third inductor 216 and the fourth inductor 218 respectively. Moreover, the first impedance tuning circuit 214 and the second impedance tuning circuit 220 may each include a second switch 236 and 238 coupled to a first auxiliary inductor 240 and a second auxiliary inductor 242 respectively. The second switches 236 and 238 may couple the first auxiliary inductor 240 and the second auxiliary inductor 242 in series to the first inductor 210 and the second inductor 212 and to the third inductor 216 and the fourth inductor 218 respectively.

Furthermore, the first impedance tuning circuit 214 and the second impedance tuning circuit 220 may each include a third switch 244 and 246 coupled to a first auxiliary capacitor 248 and a second auxiliary capacitor 250 respectively. The third switches 244 and 246 may couple the first auxiliary capacitor 248 and the second auxiliary capacitor 250 in series to the first inductor 210 and the second inductor 212 and to the third inductor 216 and the fourth inductor 218 respectively. For example, the processor 12 may provide the control signals to close the first switches 232 and 234, the second switches 236 and 238, or the third switches 244 and 246. Accordingly, the processor 12 may adjust the output reactance of the transformer 202, and therefore, select the transmission frequency range for providing the analog output signal 64 and the RF signal 50.

In some embodiments, an inductance value of the first auxiliary inductor 240 and the second auxiliary inductor 242, a capacitance value of the first auxiliary capacitor 248 and the second auxiliary capacitor 250, or both may be similar (e.g., approximately similar, relatively similar) In such embodiments, the DAC 40 and the transformer 202 may generate and provide the analog output signal 64 based on receiving the bit stream 38 with an improved balance and/or power gain efficiency. Moreover it should be appreciated that the first branch 206 and the second branch 208 may each, alternatively or additionally, use the impedance tuning circuit 170 of FIG. 7 described above to adjust the output reactance of the transformer with more granular settings. Furthermore, it should be appreciated that the impedance tuning circuits 148, 214, and 220 of the embodiments of FIGS. 6, 7, and 10 described above are disposed on the first portions 142 and 204 of the transformers 124 and 202 by the way of example. That is, in alternative or additional embodiments, the impedance tuning circuits 148, 214, and 220 may be implemented on the second portions 150 and 222 or both the first portions 142 and 204 and the second portions 150 and 222 respectively.

Figure 13:
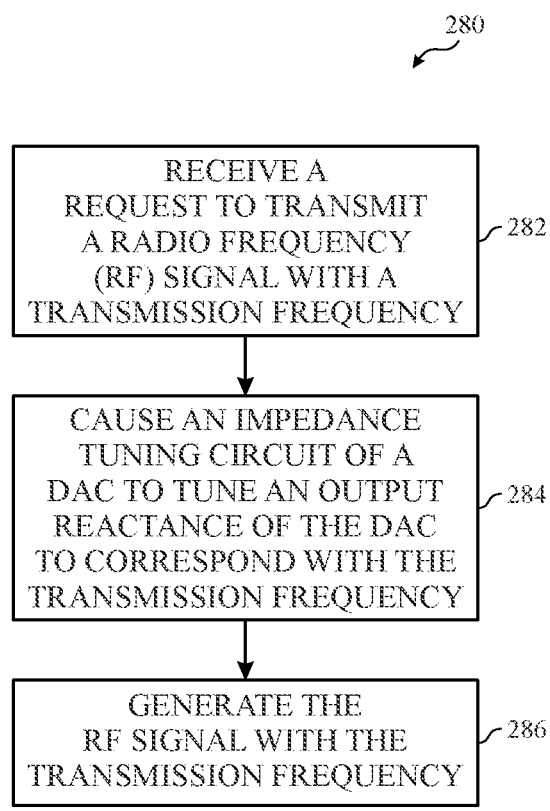
FIG. 13 is a flowchart of a process for tuning the output reactance of the DAC of FIG. 6 or 10 using the impedance tuning circuit of FIG. 7, in accordance with an embodiment of the present disclosure.

FIG. 13 is a flowchart of a process 280 performed by the processor 12 of the electronic device 10, or any other viable control or processing circuit. In particular, the processor 12 may perform the process 280 to cause generation of the RF signal 50 for transmission using the DAC 40 coupled to a transformer (e.g., the transformers 124, 190, or 202) including an impedance tuning circuit (e.g., the impedance tuning circuits 148, 170, or 214). It should be appreciated that the process blocks of the process 280 are provided by the way of example, and in different embodiments, the processor 12 may perform different process blocks, perform the process blocks in different orders, or skip some process blocks altogether.

At block 282, the processor 12 receives a request for transmitting the RF signal 50 with a transmission frequency. In alternative or additional cases, the request may include the transmission frequency and/or the electronic device 10 may request an available frequency channel for transmitting the RF signal 50.

At block 284, the processor 12 causes an impedance tuning circuit (e.g., the impedance tuning circuits 148, 170, or 214) coupled to the DAC 40 to tune (e.g., adjust) the output reactance of the DAC 40 to correspond with the transmission frequency. For example, the processor 12 may provide one or more control signals to the impedance tuning circuit to tune the output reactance of the DAC 40 based on accessing information associated with transmission frequency settings of the DAC 40 stored in the memory 14 and/or the storage 16 (e.g., in a lookup table) of the electronic device 10.

In particular, the processor 12 may cause one or more capacitors (e.g., 164, 174-1-174-N, 248, 250, and so on) to apply capacitance in the transformers 124, 190, or 202, causing a decrease in reactance. Additionally or alternatively, the processor 12 may cause one or more inductors (e.g., 160, 172-1-172-N, 240, 224, and so on) to apply inductance in the transformers 124, 190, or 202, causing an increase in reactance. For example, tuning an output reactance of the DAC 40 may shift a center frequency to select a transmission frequency range for providing the RF signal 50.

At block 286, the processor 12 may cause the transmitter 30 to generate the RF signal 50 with the transmission frequency. In particular, the processor 12 may provide one or more control signals to the transmitter 30 (e.g., the transformers 124, 190, or 202 coupled to the DAC 40 of the transmitter) to generate the RF signal 50 for transmission based on receiving the data bits (e.g., the bit stream 38) using the transmission frequency.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C.

What is claimed is:

1. An electronic device, comprising:
one or more antennas configured to transmit one or more radio frequency (RF) signals; and
a transmitter coupled to the one or more antennas, the transmitter comprising a transformer comprising,
a primary portion configured to receive one or more analog signals indicative of the one or more RF signals, the primary portion having
a first inductor,
a second inductor, and
an impedance tuning circuit coupled in series between the first inductor and the second inductor, the impedance tuning circuit comprising a first auxiliary capacitor configured to increase a transmission frequency range of the transmitter, and
a secondary portion configured to provide the one or more analog signals to one or more downstream components of the electronic device for transmission via the one or more antennas, the secondary portion having a third inductor configured to inductively couple to the first inductor, and a fourth inductor configured to inductively couple to the second inductor.

2. The electronic device of claim 1, wherein the transmitter comprises a digital-to-analog converter (DAC), the DAC being coupled to the transformer, and the impedance tuning circuit being configured to adjust an output impedance of the DAC for providing the one or more analog signals, wherein the impedance tuning circuit is configured to adjust an output reactance of the DAC to adjust the output impedance of the DAC.

3. The electronic device of claim 1, wherein the impedance tuning circuit comprises a first auxiliary inductor coupled in parallel to the first auxiliary capacitor, the first auxiliary inductor configured to decrease the transmission frequency range of the transmitter based on an inductance value of the first auxiliary inductor.

4. The electronic device of claim 3, wherein the impedance tuning circuit comprises
a first switch coupled in series with the first auxiliary inductor, the first switch configured to couple the first auxiliary inductor in series with the first inductor and the second inductor of the primary portion,
a second switch coupled in series with the first auxiliary capacitor, the second switch configured to couple the first auxiliary capacitor in series with the first inductor and the second inductor of the primary portion, and
a third switch coupled in parallel with the first switch and the first auxiliary inductor and the second switch and the first auxiliary capacitor, the third switch configured to provide a conductive path to bypass the first switch and the first auxiliary inductor and the second switch and the first auxiliary capacitor.

5. The electronic device of claim 3, wherein the transmitter comprises a digital-to-analog converter (DAC), the DAC being coupled to the primary portion of the transformer, and the impedance tuning circuit comprises
a second auxiliary inductor coupled in parallel with the first auxiliary inductor and the first auxiliary capacitor, the second auxiliary inductor configured to decrease the transmission frequency range of the DAC lower than that of the first auxiliary inductor based on an inductance value of the second auxiliary inductor being higher than the inductance value of the first auxiliary inductor, and
a second auxiliary capacitor coupled in parallel with the first auxiliary inductor, the first auxiliary capacitor, and the second auxiliary inductor, the second auxiliary capacitor configured to increase the transmission frequency range of the DAC higher than that of the first auxiliary capacitor based on a capacitance value of the second auxiliary capacitor being higher than a capacitance value of the first auxiliary capacitor.

6. The electronic device of claim 3, wherein the inductance value of the first auxiliary inductor is substantially equal to an inductance value of the second inductor, and wherein the impedance tuning circuit is coupled between the first inductor and the second inductor.

7. The electronic device of claim 1, wherein the transmitter comprises a digital-to-analog converter (DAC), the DAC being coupled to the primary portion of the transformer, the DAC configured to provide the one or more analog signals to the primary portion of the transformer.

8. The electronic device of claim 7, wherein the DAC comprises capacitors and resistors configured to receive a number of data bits and provide the one or more analog signals.

9. A tunable matching network, comprising:
a primary portion configured to receive one or more analog signals, the primary portion having
a first inductor,
a second inductor, and
a first impedance tuning circuit comprising at least a first auxiliary capacitor, the first impedance tuning circuit coupled in series between the first inductor and the second inductor, and
a secondary portion configured to convey the one or more analog signals to a downstream load, the secondary portion having
a third inductor configured to inductively couple to the first inductor, and
a fourth inductor coupled in series with the third inductor and configured to inductively couple to the second inductor.

10. The tunable matching network of claim 9, wherein the first impedance tuning circuit comprises
a first auxiliary inductor selectable to shift an output signal frequency range of the tunable matching network lower based on a first inductance value of the first auxiliary inductor, and
the first auxiliary capacitor coupled in parallel with the first auxiliary inductor, the first auxiliary capacitor selectable to shift the output signal frequency range of the tunable matching network higher based on a first capacitance value of the first auxiliary capacitor.

11. The tunable matching network of claim 10, wherein the first impedance tuning circuit comprises
a first switch coupled in series with the first auxiliary inductor, the first switch configured to couple the first auxiliary inductor in series with the first inductor and the second inductor of the primary portion,
a second switch coupled in series with the first auxiliary capacitor, the second switch configured to couple the first auxiliary capacitor in series with the first inductor and the second inductor of the primary portion, and
a third switch coupled in parallel with the first switch and the first auxiliary inductor and the second switch and the first auxiliary capacitor, the third switch configured to provide a conductive path to bypass the first switch and the first auxiliary inductor and the second switch and the first auxiliary capacitor.

12. The tunable matching network of claim 10, wherein the first impedance tuning circuit comprises
- a second auxiliary inductor coupled in parallel with the first auxiliary inductor and the first auxiliary capacitor, selecting the second auxiliary inductor shifts the output signal frequency range of the tunable matching network lower than selecting the first auxiliary inductor based on a second inductance value of the second auxiliary inductor having a higher value than the first inductance value of the first auxiliary inductor, and
- a second auxiliary capacitor coupled in parallel with the first auxiliary inductor, the first auxiliary capacitor, and the second auxiliary inductor, selecting the second auxiliary capacitor shifts the output signal frequency range of the tunable matching network higher than selecting the first auxiliary capacitor based on a second capacitance value of the second auxiliary capacitor having a higher value than the first capacitance value of the first auxiliary capacitor.

13. The tunable matching network of claim 12, wherein the first impedance tuning circuit comprises
- a fourth switch coupled in series with the second auxiliary inductor, the fourth switch configured to couple the second auxiliary inductor in series with the first inductor and the second inductor of the primary portion, and
- a fifth switch coupled in series with the second auxiliary capacitor, the fifth switch configured to couple the second auxiliary capacitor in series with the first inductor and the second inductor of the primary portion.

14. The tunable matching network of claim 9, wherein the primary portion comprises
- a first branch comprising the first inductor, the second inductor, and the first impedance tuning circuit, and
- a second branch comprising a fifth inductor, a sixth inductor, and a second impedance tuning circuit, the first branch and the second branch being configured to receive one or more data bits in parallel, and the secondary portion comprises
- a seventh inductor coupled in series to the third inductor and the fourth inductor and configured to inductively couple to the fifth inductor, and
- an eighth inductor coupled in series to the third inductor, the fourth inductor, and the fifth inductor and configured to inductively couple to the sixth inductor.

15. A method comprising:
- receiving, by a processor of an electronic device, a first request to transmit a first radio frequency (RF) signal with a first transmission frequency;
- adjusting, by the processor, an impedance tuning circuit coupled in series with a first inductor and a second inductor of a primary portion of a transformer based on the first transmission frequency, wherein the transformer is coupled to an output of a digital-to-analog converter (DAC) of the electronic device; and
- providing, by the processor, first data bits associated with generating the first RF signal to the DAC to cause generation of the first RF signal with the first transmission frequency.

16. The method of claim 15, wherein adjusting, by the processor, the impedance tuning circuit adjusts an output reactance of the transformer.

17. The method of claim 15, wherein adjusting, by the processor, the impedance tuning circuit comprises coupling an auxiliary capacitor or an auxiliary inductor of the impedance tuning circuit to the first inductor and the second inductor.

18. The method of claim 15, comprising determining a transmission frequency range of a plurality of selectable transmission frequency ranges associated with the transformer, wherein the transmission frequency range comprises the first transmission frequency.

19. The method of claim 15, wherein comprising accessing, by the processor, information associated with the first transmission frequency stored in a memory or storage of the electronic device.

20. The method of claim 15, comprising:
- receiving, by the processor, a second request to transmit a second RF signal with a second transmission frequency different from the first transmission frequency;
- adjusting, by the processor, the impedance tuning circuit based on the second transmission frequency; and
- providing, by the processor, second data bits associated with generating the second RF signal to the DAC to cause generation of the first RF signal with the second transmission frequency.

* * * * *